(12) United States Patent
Tziviskos (10) Patent No.: US 10,931,058 B2
(45) Date of Patent: *Feb. 23, 2021

(54) GASKETS FOR SEALING SPRING-LOADED CONTACTS

(71) Applicant: Apple Inc., Cupertino, CA (US)

(72) Inventor: George Tziviskos, San Jose, CA (US)

(73) Assignee: Apple Inc., Cupertino, CA (US)

( * ) Notice: Subject to any disclaimer, the term of this patent is extended or adjusted under 35 U.S.C. 154(b) by 105 days.

This patent is subject to a terminal disclaimer.

(21) Appl. No.: 16/194,260

(22) Filed: Nov. 16, 2018

(65) Prior Publication Data

US 2020/0099162 A1 Mar. 26, 2020

Related U.S. Application Data

(60) Provisional application No. 62/735,804, filed on Sep. 24, 2018.

(51) Int. Cl.
| | |
|---|---|
| *H01R 13/52* | (2006.01) |
| *H05K 5/02* | (2006.01) |
| *H01F 7/02* | (2006.01) |
| *H01R 13/17* | (2006.01) |
| *H01R 13/15* | (2006.01) |
| *H01R 13/24* | (2006.01) |
| *H01R 13/62* | (2006.01) |

(52) U.S. Cl.
CPC ............ *H01R 13/521* (2013.01); *H01F 7/02* (2013.01); *H01R 13/15* (2013.01); *H01R 13/17* (2013.01); *H05K 5/0247* (2013.01); *H01R 13/2421* (2013.01); *H01R 13/6205* (2013.01)

(58) Field of Classification Search
CPC ...... H01R 13/521; H01R 13/15; H01R 13/17; H01R 13/2421; H01R 13/6205; H01F 7/02; H05K 5/0247
USPC ................................ 439/271, 289, 700, 824
See application file for complete search history.

(56) References Cited

U.S. PATENT DOCUMENTS

| | | | | |
|---|---|---|---|---|
| 2,644,145 A | * | 6/1953 | Adams | H01R 13/2421 |
| | | | | 439/824 |
| 2,858,518 A | * | 10/1958 | Chrystie | H01R 13/02 |
| | | | | 439/426 |
| 4,142,770 A | * | 3/1979 | Butler, Jr. | H01R 13/523 |
| | | | | 439/140 |
| 4,146,286 A | | 3/1979 | Jones | |
| 4,795,359 A | * | 1/1989 | Alcock | H01R 13/523 |
| | | | | 439/271 |
| 4,891,013 A | | 1/1990 | Komaki | |
| 4,894,495 A | | 1/1990 | Toda | |
| 5,052,484 A | | 10/1991 | Gesta | |
| 5,562,467 A | | 10/1996 | Davis, II et al. | |
| 6,431,912 B1 | * | 8/2002 | Mori | H01R 13/2421 |
| | | | | 439/587 |

(Continued)

OTHER PUBLICATIONS

U.S. Appl. No. 16/373,539, Notice of Allowance dated Dec. 4, 2019, 10 pages.

(Continued)

*Primary Examiner* — Travis S Chambers (74) *Attorney, Agent, or Firm* — Kilpatrick Townsend & Stockton, LLP (57) ABSTRACT

Structures and methods for connector assemblies and their spring-loaded contacts that may resist corrosion, consume a minimal volume in an electronic device, and are readily manufactured.

20 Claims, 7 Drawing Sheets

(56) References Cited

U.S. PATENT DOCUMENTS

| | | | |
|---|---|---|---|
| 6,447,343 B1* | 9/2002 | Zhang | H01R 13/2421 439/289 |
| 8,460,008 B1 | 6/2013 | Lin et al. | |
| 8,469,731 B2 | 6/2013 | Gloaguen et al. | |
| 8,506,314 B2 | 8/2013 | Gramsamer et al. | |
| 9,077,105 B2 | 7/2015 | Kim | |
| 9,088,098 B2 | 7/2015 | Hwang | |
| 9,130,291 B2 | 9/2015 | Poh et al. | |
| 9,160,102 B1 | 10/2015 | Morgan et al. | |
| 9,391,390 B2 | 7/2016 | Endo et al. | |
| 9,431,182 B2 | 8/2016 | Kim et al. | |
| 9,431,759 B2 | 8/2016 | Hirano et al. | |
| 9,450,362 B2 | 9/2016 | Wang | |
| 9,847,609 B2 | 12/2017 | Planard-Luong | |
| 9,876,307 B2 | 1/2018 | Wagman et al. | |
| 9,899,757 B2 | 2/2018 | Do | |
| 10,050,378 B2 | 8/2018 | Szeto | |
| 10,177,490 B2 | 1/2019 | Michelmann et al. | |
| 10,303,213 B2 | 5/2019 | Shaw et al. | |
| 10,317,430 B2 | 6/2019 | Nagata | |
| 10,433,584 B2 | 10/2019 | Nettenstrom et al. | |
| 10,446,948 B2 | 10/2019 | Szeto et al. | |
| 10,547,135 B2* | 1/2020 | Sugiura | H01R 13/2421 |
| 10,622,756 B1* | 4/2020 | Tziviskos | H01R 13/17 |
| 2008/0220647 A1* | 9/2008 | Mathews | H01R 13/5202 439/583 |
| 2010/0120290 A1* | 5/2010 | Ko | H01R 13/7175 439/626 |
| 2011/0189878 A1* | 8/2011 | Rogers | H01R 13/52 439/271 |
| 2012/0028489 A1* | 2/2012 | Gramsamer | H01R 13/521 439/271 |
| 2012/0032765 A1 | 2/2012 | Bilbrey et al. | |
| 2012/0295451 A1 | 11/2012 | Hyun-Jun et al. | |
| 2015/0280370 A1 | 10/2015 | Huang et al. | |
| 2015/0288108 A1* | 10/2015 | Fischer | H01R 13/652 439/88 |
| 2019/0067859 A1 | 2/2019 | Sugiura | |
| 2019/0243420 A1 | 8/2019 | Shaw et al. | |

OTHER PUBLICATIONS

U.S. Appl. No. 16/373,539 (unpublished) filed Apr. 2, 2019, entitled, Gaskets for Sealing Spring-Loaded Contacts, Tziviskos, et al., 42 pages.

Yokowo Spring Loaded Connector Waterproof System, "Reflow Type" Product Image Sheet, [online], Yokowo America Corporation, [retrieved on Nov. 30, 2018], retrieved from the Internet: <URL: http://www.yokowoconnector.com/technology/content_02/index2.html>, 2 pages.

Yokowo Spring Loaded Connector Waterproof System, "Built in Type" Product Image Sheet, [online], Yokowo America Corporation, [retrieved on Nov. 30, 2018], retrieved from the Internet: <URL: http://www.yokowoconnector.com/technology/content_02/index3.html, 1 page.

* cited by examiner

GASKETS FOR SEALING SPRING-LOADED CONTACTS

CROSS REFERENCE TO RELATED APPLICATIONS

The present application claims the benefit of U.S. provisional application No. 62/735,804, filed Sep. 24, 2018, which is incorporated by reference.

BACKGROUND

Power and data may be provided from one electronic device to another over contacts on the electronic devices. In some electronic systems, contacts of two electronic devices may come into direct contact with each other without the need for intervening cables. For example, spring-loaded contacts on a first electronic device may form physical and electrical connections with contacts on a surface of a second electronic device. The spring-loaded contacts of an electronic device may be housed in a connector assembly, which may be located in a device enclosure that at least partially houses the electronic devices.

These contacts and connector assemblies may be exposed to liquids and fluids that may cause their contacts to corrode. For example, a user may purposely or inadvertently submerge an electronic device or a connector assembly in a liquid. A user may spill a liquid or perspire on contacts of a connector assembly of an electronic device or cable. These actions may cause one or more contacts to corrode, particularly where a voltage is present on the one or more contacts. This corrosion may impair the operation of the electronic device and in severe cases may render the electronic device or cable inoperable. Even where operation is not fully impaired, device operation may become inconsistent or unreliable. Also, this corrosion may mar the appearance of the contacts.

Electronic devices for these connector assemblies may be small. As a result, these connector assemblies may consume a large amount of space inside the electronic device. Accordingly, it may be desirable that these connector assemblies be small.

Also, some of these electronic devices become tremendously popular. As a result, connector assemblies on electronic devices may be sold in very large quantities. Therefore, it may be desirable that these connector assemblies be readily manufactured such that customer demand for them may be met.

Thus, what is needed are structures and methods for connector assemblies and their spring-loaded contacts that may resist corrosion, consume a minimal volume in an electronic device, and are readily manufactured.

SUMMARY

Structures and methods for connector assemblies and their spring-loaded contacts that may resist corrosion, consume a minimal volume in an electronic device, and are readily manufactured.

An illustrative embodiment of the present invention may provide connector assemblies that may provide movable contacts at a surface of an electronic device. The connector assemblies may include a nonconductive connector assembly housing supporting one, two, three, or more movable contacts. Each movable contact may be a spring-loaded contact. The spring-loaded contacts may have contacting portions that emerge from corresponding openings in the connector assembly housing.

The connector assembly may be located in a device enclosure, where the device enclosure may fully, substantially, or at least partially house electronic components for the electronic device supporting the connector assembly. The connector assembly may include the connector assembly housing to support the spring-loaded contacts. The spring-loaded contacts may include a plunger located in a barrel, where the plunger may move in the barrel. The barrel may have a front opening that is narrowed to limit the travel of the plunger, which may have a widened base portion and a narrow contacting portion extending from the barrel. This may prevent the plunger from exiting the barrel. The barrel may include barbs along its side to help to secure the barrel in the connector assembly housing. A spring may be located in the barrel and between a backside of the plunger and a back of the barrel to bias the plunger out of the barrel. A gasket may be located between the connector assembly housing and the spring-loaded contact. This gasket may help to prevent the ingress of liquid, moisture, debris, or other substances into the electronic device housing the connector assembly.

In these and other embodiments of the present invention, a gasket may be located between the connector assembly housing and the plunger of each spring-loaded contact. For example, the connector assembly housing may include a top surface. The top surface may be positioned around the plunger of a spring-loaded contact, where the plunger passes through an opening in connector assembly housing. The gasket may have an outer ring that may be attached to the top surface of the connector assembly housing. The gasket may further have an inner ring that may fit around a circumference of the contacting portion of the plunger. The contact assembly may be located in a device enclosure such that the outer ring of the gasket is between the top surface of the connector assembly housing and a bottom or inside surface of the device enclosure. This may help to secure the gasket in place, thereby improving the resulting seal. The device enclosure may include openings, recesses, and other features to allow access of the contacting portions of the spring-loaded contacts by contacts of a second electronic device. In these and other embodiments of the present invention, an interference rib may be formed on the top surface of the connector assembly housing and positioned under the outside ring of the gasket. This may help to seal the outside ring of the gasket to the connector assembly housing. Adhesives, such as pressure-sensitive adhesives, temperature-sensitive adhesives, or heat-activated adhesives may be used to attach the gaskets to any or all of a connector assembly housing, a device enclosure, or a plunger of the spring-loaded contact.

These gaskets may help to protect the ingress path from an outside of the device enclosure and into the electronic device. For example, it may protect the ingress path from an outside of the device enclosure, though a spring-loaded contact between the plunger and barrel, and into the electronic device. This may help to reduce an amount of liquid or other substance that may enter and corrode the inside of the spring-loaded contact and electronic device. It may also protect the ingress path from an outside of the device enclosure, between the plunger and connector assembly housing, and into the electronic device. This may help to reduce an amount of liquid or other substance that may enter and corrode the outside of the spring-loaded contact and electronic device.

In these and other embodiments of the present invention, the gasket may further include a bellows between the outer ring and the inner ring. These bellows may form a recessed portion. Liquid or other material may flow away from the plunger and instead gather at this recessed portion. This may help to prevent or reduce the corrosion of the plunger. The liquid or other material may evaporate while it is located in the recessed portion of the bellows thereby reducing the corrosion of the plunger.

In these and other embodiments of the present invention, the gasket may be made of various materials, such as silicone or other material. The material may be a low compression set material that is flexible and soft. It may have a Shore durometer of 20A, 30A, 45A, or it may have another shore durometer.

In these and other embodiments of the present invention, a second gasket or O-ring may be located between the barrel and the connector assembly housing. Also, other structures may be included to protect these leakage paths and help to reduce the amount of ingress of liquids or other substances into the spring-loaded contacts and electronic device.

In these and other embodiments of the present invention, the connector assemblies may be kept small by only using two spring-loaded contacts. These contacts may be used to convey power. They may also be used to convey data, or data may be wirelessly transmitted and received by the electronic device.

Embodiments of the present invention may provide connector assemblies that may be located in various types of devices, such as portable computing devices, tablet computers, desktop computers, laptops, all-in-one computers, wearable computing devices, cell phones, smart phones, media phones, storage devices, keyboards, covers, charging cases, portable media players, navigation systems, monitors, power supplies, adapters, audio devices and equipment, remote control devices, chargers, and other devices. These connector assemblies may provide pathways for signals and power compliant with various standards such as one of the Universal Serial Bus (USB) standards including USB Type-C, High-Definition Multimedia Interface® (HDMI), Digital Visual Interface (DVI), Ethernet, DisplayPort, Thunderbolt™, Lightning™ Joint Test Action Group (JTAG), test-access-port (TAP), Directed Automated Random Testing (DART), universal asynchronous receiver/transmitters (UARTs), clock signals, power signals, and other types of standard, non-standard, and proprietary interfaces and combinations thereof that have been developed, are being developed, or will be developed in the future. In one example, the connector assemblies may be used to convey a data signal, a power supply, and ground. In various embodiments of the present invention, the data signal may be unidirectional or bidirectional and the power supply may be unidirectional or bidirectional. In these and other embodiments of the present invention, the connector assemblies may be used to convey power and ground, while data is transmitted wirelessly.

Various embodiments of the present invention may incorporate one or more of these and the other features described herein. A better understanding of the nature and advantages of the present invention may be gained by reference to the following detailed description and the accompanying drawings.

DESCRIPTION OF EXEMPLARY EMBODIMENTS

Figure 1:
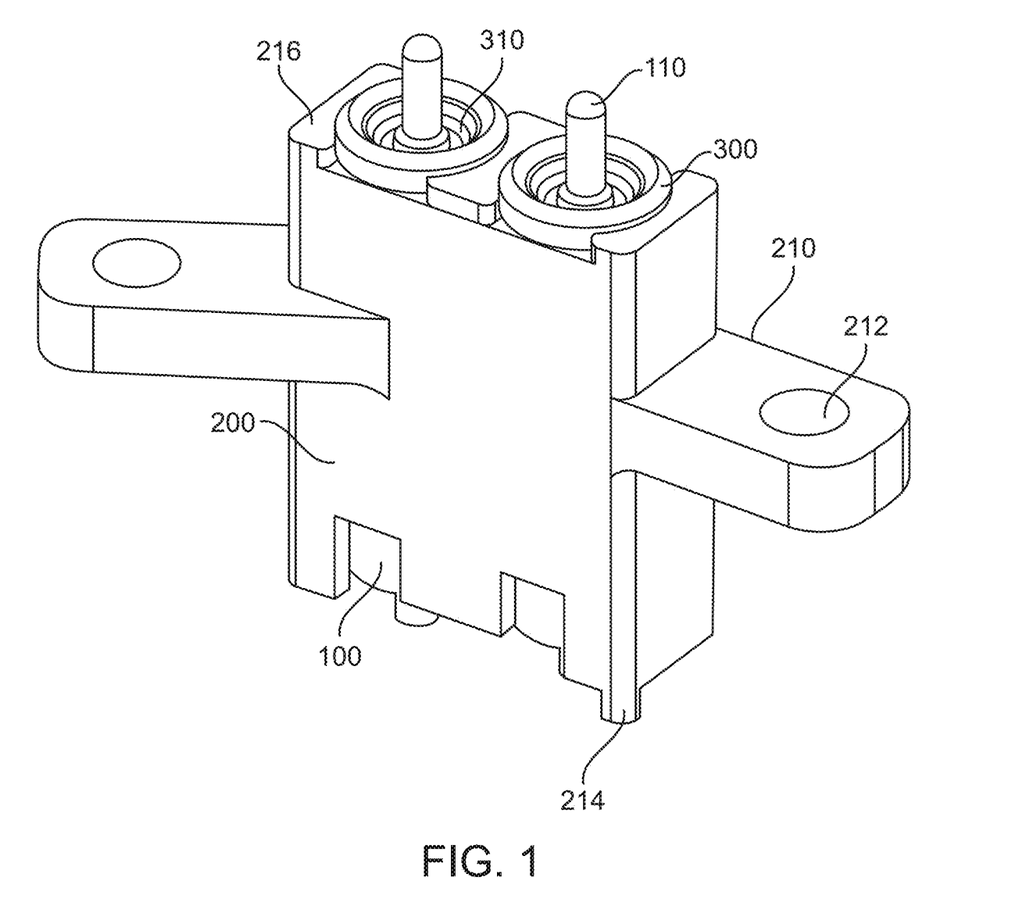
FIG. 1 illustrates a connector assembly according to an embodiment of the present invention.

FIG. 1 illustrates a connector assembly according to an embodiment of the present invention. This figure, as with the other included figures, is shown for illustrative purposes and does not limit either the possible embodiments of the present invention or the claims.

In this example, connector assembly housing 200 may support two spring-loaded contacts 100, though one, three, or more than three spring-loaded contacts 100 may be included in connector assembly housing 200. Connector assembly housing 200 may further include flanges 210 having openings 212 for fasteners (not shown.) Fasteners may be inserted into openings 212 and may secure connector assembly housing 200 to device enclosure 400 (shown in FIG. 3.) Connector assembly housing 200 may further include posts 214. Posts 214 may be inserted into a corresponding opening (not shown) in device enclosure 400. Connector assembly housing 200 may further include top surface 216. Plungers 110 may extend through top surface 216 of connector assembly housing 200. Gasket 300 may extend from around plunger 110 to top surface 216 of connector assembly housing 200 to form a seal. Gasket 300 may include bellows or recess 310.

Connector assembly housing 200 may be formed in various ways in various embodiments of the present invention. For example, connector assembly housing 200 may be formed by injection molding, insert molding, 3-D printing, or other method. It may be formed of nylon, plastic, liquid-crystal polymer (LCP), or other material.

Figure 2:
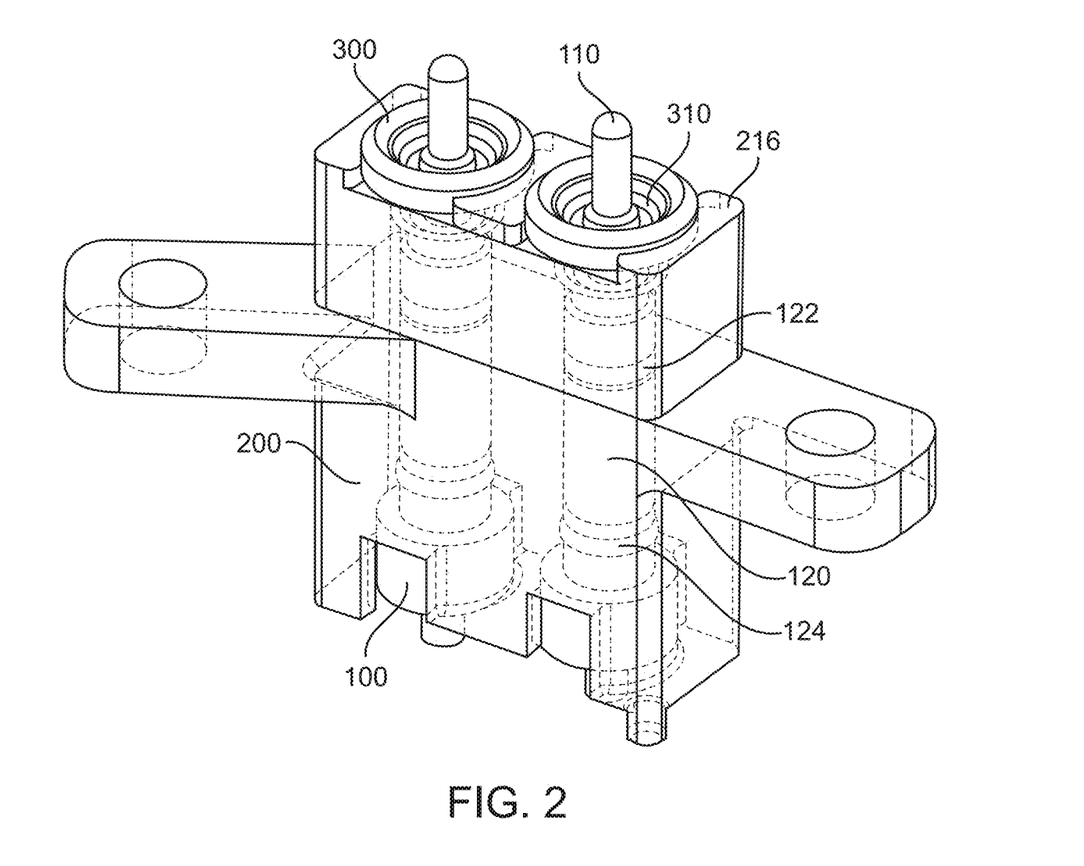
FIG. 2 illustrates the connector assembly of FIG. 1 where the connector assembly housing is transparent.

FIG. 2 illustrates the connector assembly of FIG. 1 where the connector assembly housing is transparent. Again, two spring-loaded contacts 100 may be located in passages in connector assembly housing 200. Spring-loaded contacts 100 may include barb 122 and barb 124 on barrel 120. Barb 122 and barb 124 may help to secure spring-loaded contacts 100 in connector assembly housing 200.

Again, gaskets 300 may form a seal between top surface 216 of connector assembly housing 200 and plungers 110 of each spring-loaded contact 100. Gaskets 300 may include a bellows or recess (or reservoir) 310. Liquid or other material may flow away from plunger 110 and gather instead in bellows or recess 310. This may help to prevent or reduce the corrosion of plunger 110. The liquid or other material may evaporate while it is located in the bellows or recess 310 thereby reducing the corrosion of plunger 110.

Gaskets 300 may help to protect an ingress path from an outside of device enclosure 400 (shown in FIG. 3) and into an electronic device (not shown.) For example, they may protect the ingress path from an outside of device enclosure 400, though spring-loaded contact 100 between plunger 110 and barrel 120, and into the electronic device. This may help to reduce an amount of liquid or other substance that may enter and corrode the inside of spring-loaded contact 100 and the electronic device. They may also protect the ingress path from an outside of device enclosure 400, between plunger 110 and connector assembly housing 200, and into the electronic device. This may help to reduce an amount of liquid or other substance that may enter and corrode the outside of spring-loaded contact 100 and the electronic device.

Figure 3:
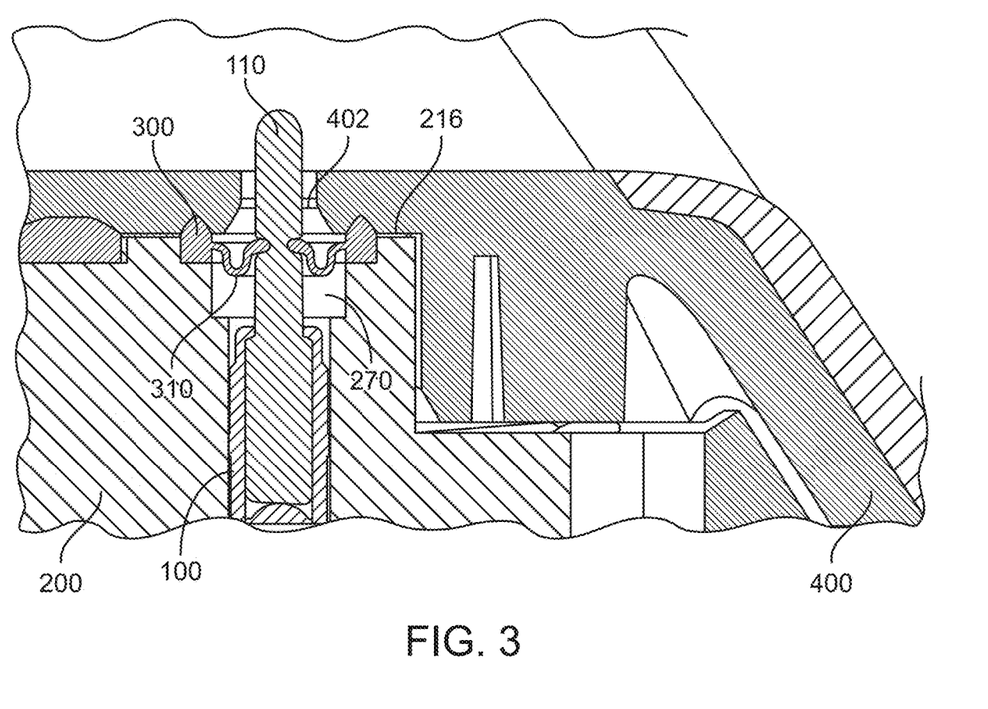
FIG. 3 illustrates the connector assembly housing of FIG. 1 in a device enclosure according to an embodiment of the present invention.

FIG. 3 illustrates the connector assembly housing of FIG. 1 in a device enclosure according to an embodiment of the present invention. As before, spring-loaded contact 100 may be housed in connector assembly housing 200. Plunger 110 of spring-loaded contact 100 may emerge through opening 270 in connector assembly housing 200. Plunger 110 of spring-loaded contact 100 may also emerge through opening 402 in device enclosure 400.

Gasket 300 may form a seal between top surface 216 of connector assembly housing 200 and plunger 110. Gasket 300 may include bellows or recess 310 as before.

Figure 4:
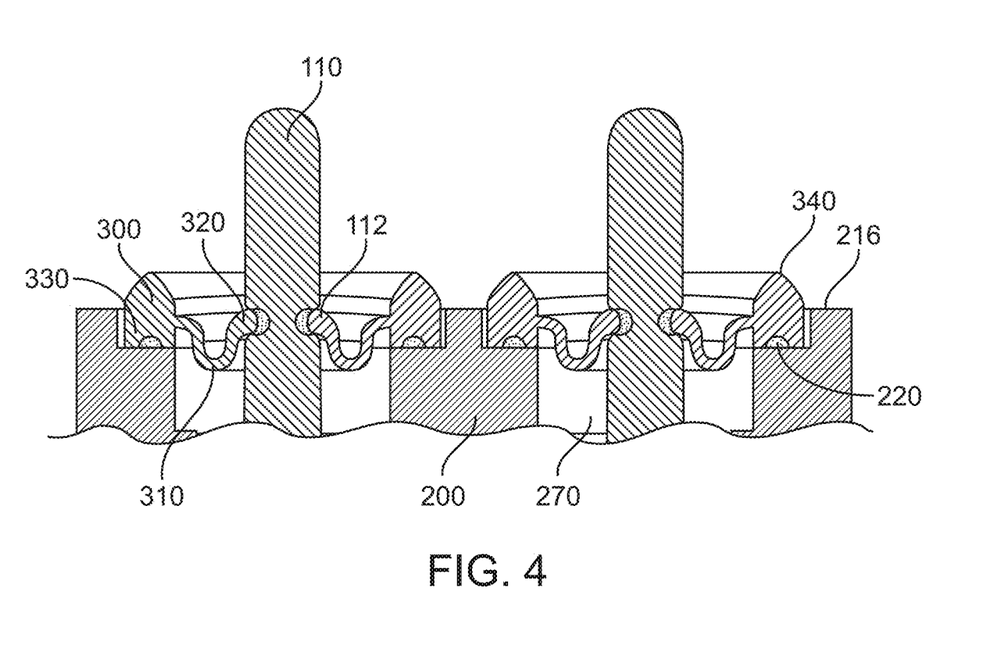
FIG. 4 illustrates a cutaway side view of a portion of a connector assembly according to an embodiment of the present invention.

FIG. 4 illustrates a cutaway side view of a portion of a connector assembly according to an embodiment of the present invention. In this example, plungers 110 may emerge through openings 270 in connector assembly housing 200. Gasket 300 may form a seal between connector assembly housing 200 top surface 216 and plunger 110. Gaskets 300 may include outer ring 330. Outer ring 330 may be located over interference rib 220 on top surface 216 of connector assembly housing 200. Outer ring 330 may include surface 340, which may mate with device enclosure 400 (shown in FIG. 3.) Gaskets 300 may further include inner ring 320, which may fit in circumferential groove 112 around plunger 110. Gaskets 300 may further include bellows or recess 310. Again, liquid or other materials may accumulate in recess 310 and thus be kept away from plunger 110. This may help to slow or reduce the corrosion of plunger 110, as well as the remaining portions of spring-loaded contact 100 (shown in more detail in FIG. 5) and an electronic device (not shown) housed by device enclosure 400 (shown in FIG. 3.)

Figure 5:
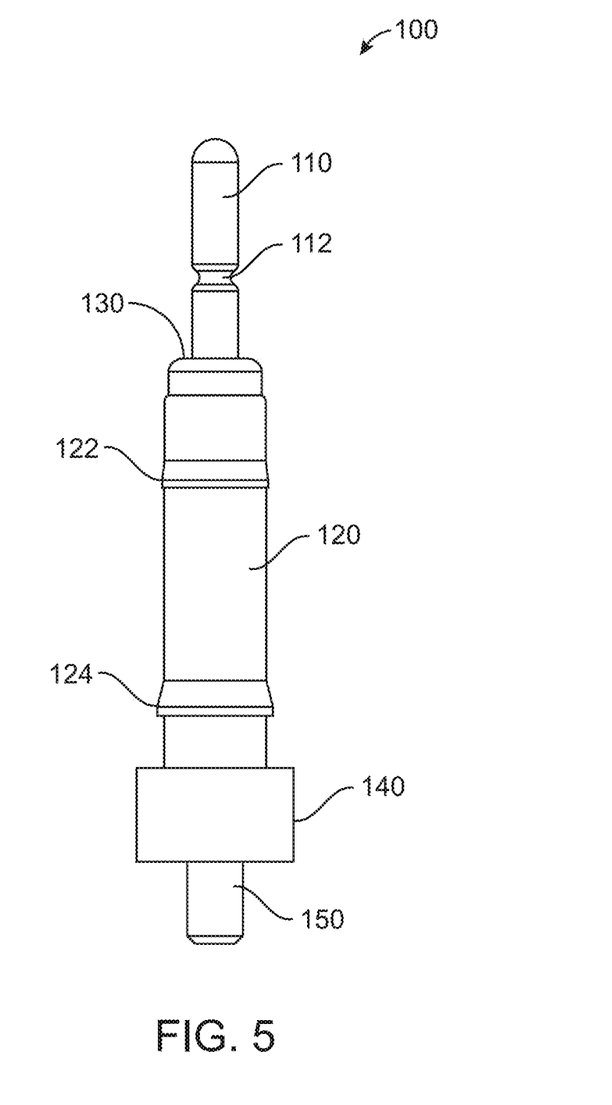
FIG. 5 illustrates a spring-loaded contact according to an embodiment of the present invention

FIG. 5 illustrates a spring-loaded contact according to an embodiment of the present invention. Again, spring-loaded contact 100 may include plunger 110 emerging from front opening 130 in barrel 120. Barb 122 and barb 124 may be located on barrel 120. Barb 122 and barb 124 may help to secure spring-loaded contact 100 in connector assembly housing 200 (as shown in FIG. 2.) Spring-loaded contact 100 may further include a base portion 140 and tail 150. Tail 150 may be soldered or otherwise connected to a wire, a trace on a board (not shown), or other conduit. Base portion 140 may form a rear wall of a cavity (not shown) inside barrel 120. Barrel 120 may have front opening 130 that is narrowed to limit the travel of plunger 110, which may have a widened base portion (not shown) and a narrow contacting portion (shown as plunger 110) extending from barrel 120. A spring (not shown) may be located in barrel 120 and may be between plunger 110 and this rear wall. As plunger 110 forms a physical and electrical connection with a corresponding contacts of a corresponding device (not shown), plunger 110 may be pushed down into barrel 120, thereby compressing the spring. As the corresponding device is removed, plunger 110 may be driven back out of barrel 120 by the spring.

Figure 6:
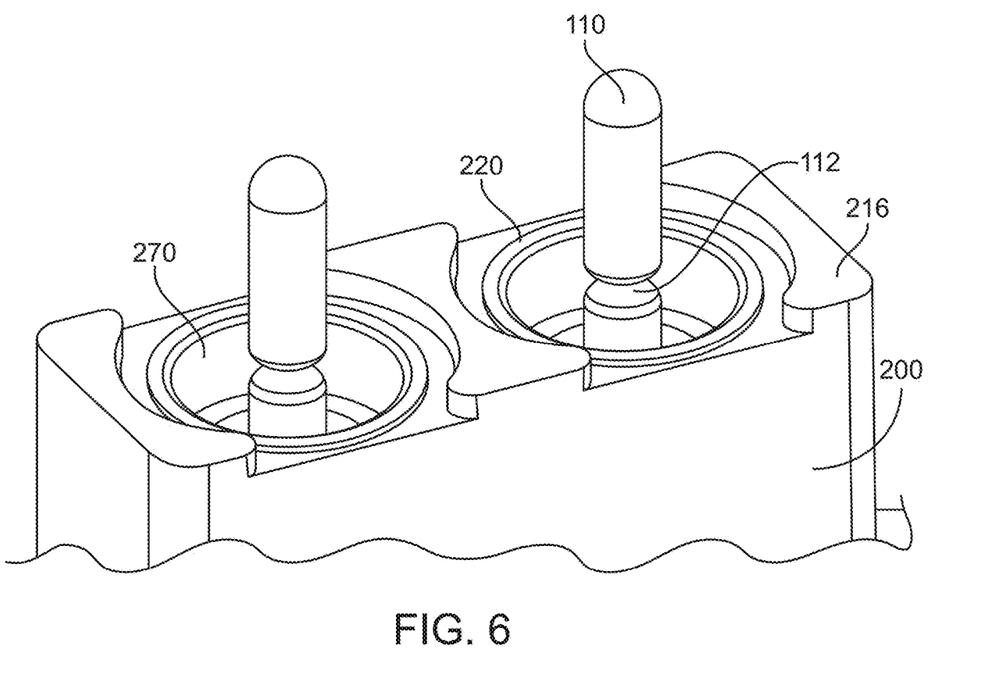
FIG. 6 illustrates a close-up view of a top of a connector assembly housing according to an embodiment of the present invention.
Figure 7:
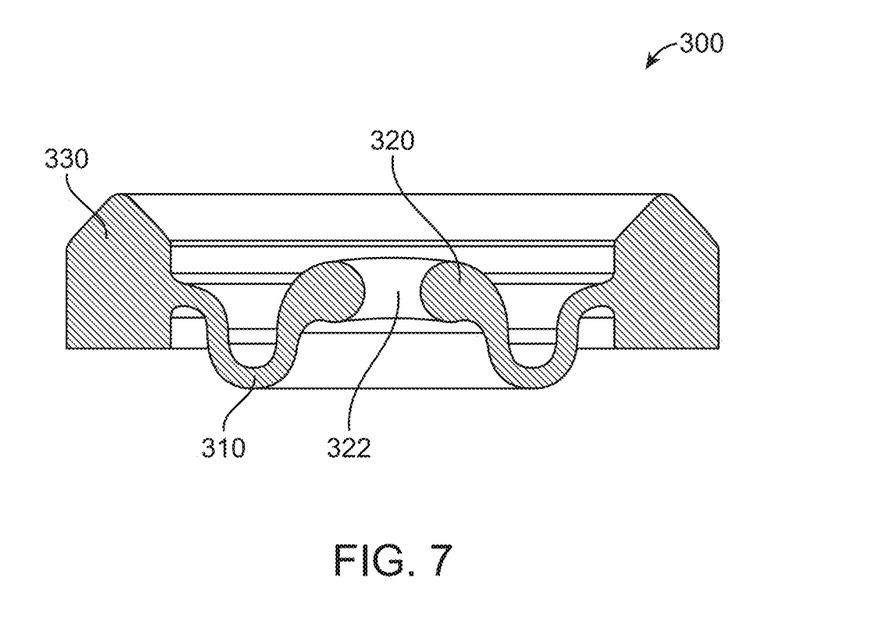
FIG. 7 illustrates a cutaway side view of a gasket according to an embodiment of the present invention.

FIG. 6 illustrates a close-up view of a top of a connector assembly housing according to an embodiment of the present invention. Connector assembly housing 200 may include a top surface 216. Plungers 110 of spring-loaded contacts 100 (shown in FIG. 2) may emerge through opening 270. Gasket 300 (details of which are shown in FIG. 7) may have an outer ring 330 (shown in FIG. 7) to mate with interference rib 220. Device enclosure 400 (shown in FIG. 3), may compress gasket 300 into interference rib 220, thereby improving the seal formed by gasket 300. Gasket 300 may also be located around circumferential groove 112 of plunger 110.

Adhesives, such as pressure-sensitive adhesives, temperature-sensitive adhesives, or heat-activated adhesives may be used to attach gaskets 300 to any or all of a connector assembly housing 200, device enclosure 400, or plunger 110 of spring-loaded contact 100. These adhesives may work together or separately with interference rib 220.

FIG. 7 illustrates a cutaway side view of a gasket according to an embodiment of the present invention. Gasket 300 may include outer ring 330 and inner ring 320. Inner ring 320 may define an opening 322, which may allow access for plunger 110 (shown in FIG. 6.) Inner ring 320 may fit in circumferential groove 112 (shown in FIG. 6) around plunger 110. Gasket 300 may also include bellows or recess 310. Bellows or recess 310 may form a reservoir for liquids or other substances in order to protect plunger 110. Bellows or recess 310 may include a U-shaped portion joining inner ring 320 and outer ring 330. In these and other embodiments of the present invention, bellows and recess 310 may have other shapes.

In these and other embodiments of the present invention, gaskets 300 may be made of various materials, such as silicone or other material. The material may be a low compression set material that is flexible and soft. It may have a Shore durometer of 20A, 30A, 45A, or it may have another shore durometer.

In these and other embodiments of the present invention, a second gasket or O-ring (not shown) may be located between the barrel and the connector assembly housing. Also, other structures may be include to protect these leakage paths and help to reduce the amount of ingress of liquids or other substances into the spring-loaded contacts and electronic device.

In these and other embodiments of the present invention, connector assemblies may be kept small by only using two spring-loaded contacts 100. The two spring-loaded contacts 100 may be used to convey power. They may also be used to convey data, or data may be wirelessly transmitted and received by the electronic device (not shown.)

Embodiments of the present invention may provide connector assemblies that may be located in various types of devices, such as portable computing devices, tablet computers, desktop computers, laptops, all-in-one computers, wearable computing devices, cell phones, smart phones, media phones, storage devices, keyboards, covers, charging cases, portable media players, navigation systems, monitors, power supplies, adapters, audio devices and equipment, remote control devices, chargers, and other devices. These connector assemblies may provide pathways for signals and power compliant with various standards such as one of the Universal Serial Bus standards including USB Type-C, High-Definition Multimedia Interface, Digital Visual Interface, Ethernet, DisplayPort, Thunderbolt, Lightning, Joint Test Action Group, test-access-port, Directed Automated Random Testing, universal asynchronous receiver/transmitters, clock signals, power signals, and other types of standard, non-standard, and proprietary interfaces and combinations thereof that have been developed, are being developed, or will be developed in the future. In one example, the connector assemblies may be used to convey a data signal, a power supply, and ground. In various embodiments of the present invention, the data signal may be unidirectional or bidirectional and the power supply may be unidirectional or bidirectional. In these and other embodiments of the present invention, the connector assemblies may be used to convey power and ground, while data is transmitted wirelessly.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:

1. A connector assembly comprising:
   a connector assembly housing having a first passage and a second passage;
   a first spring-loaded contact in the first passage;
   a second spring-loaded contact in the second passage, wherein each of the first spring-loaded contact and the second spring-loaded contact comprises:
      a barrel having a bottom surface at a first end and a front opening at a second end;
      a plunger in the barrel and having a contacting portion extending from the front opening of the barrel and a top surface of the connector assembly housing; and
      a spring between the bottom surface of the barrel and a back surface of the plunger; and
   a first gasket around the plunger of the first spring-loaded contact; and
   a second gasket around the plunger of the second spring-loaded contact, wherein each of the first gasket and the second gasket comprises:
      an outer ring located on the top surface of the connector assembly housing; and
      an inner ring around the plunger of a corresponding spring-loaded contact.

2. The connector assembly of claim 1 wherein each of the first gasket and the second gasket further comprises a recessed portion between the outer ring and the inner ring.

3. The connector assembly of claim 1 wherein the first gasket and the second gasket are formed of silicone, and wherein the plunger of the first spring-loaded contact extends from the top surface of the connector assembly housing and beyond the first gasket.

4. The connector assembly of claim 1 wherein each of the first gasket and the second gasket further comprises a bellows between the outer ring and the inner ring.

5. The connector assembly of claim 4 wherein each of the first spring-loaded contact and the second spring-loaded contact further comprises a barb around an outside surface of the barrel.

6. The connector assembly of claim 4 wherein the plunger for each of the first spring-loaded contact and the second spring-loaded contact comprises a circumferential groove to accept the inner ring of the corresponding gasket.

7. An electronic device comprising:
   a device enclosure at least partially housing the electronic device;
   a connector assembly housing located in the device enclosure and having a first passage and a second passage;
   a first spring-loaded contact in the first passage;
   a second spring-loaded contact in the second passage, wherein each of the first spring-loaded contact and the second spring-loaded contacts comprises:
      a barrel having a bottom surface at a first end and a front opening at a second end;
      a plunger in the barrel and having a contacting portion extending from the front opening of the barrel, a top surface of the connector assembly housing, and a surface of the device enclosure; and
      a spring between the bottom surface of the barrel and a back surface of the plunger; and
   a first gasket around the plunger of the first spring-loaded contact; and
   a second gasket around the plunger of the second spring-loaded contact, wherein each of the first gasket and the second gasket comprises:
      an outer ring located on the top surface of the connector assembly housing; and
      an inner ring around the plunger of a corresponding spring-loaded contact.

8. The electronic device of claim 7 wherein the first gasket and the second gasket are formed of silicone.

9. The electronic device of claim 7 wherein the device enclosure substantially houses the electronic device.

10. The electronic device of claim 9 wherein each of the first gasket and the second gasket further comprises a bellows between the outer ring and the inner ring.

11. The electronic device of claim 9 wherein each of the first gasket and the second gasket further comprises a recessed portion between the outer ring and the inner ring.

12. The electronic device of claim 9 wherein each of the first spring-loaded contact and the second spring-loaded contact further comprises a barb around an outside surface of the barrel.

13. The electronic device of claim 9 wherein the plunger for each of the first spring-loaded contact and the second spring-loaded contact comprises a circumferential groove to accept the inner ring of the corresponding gasket.

14. A connector assembly comprising:
   a connector assembly housing having a first passage;
   a first spring-loaded contact in the first passage, wherein the first spring-loaded contact comprises:
      a barrel having a bottom surface at a first end and a front opening at a second end;
      a plunger in the barrel and having a contacting portion extending from the front opening of the barrel and a top surface of the connector assembly housing; and
      a spring between the bottom surface of the barrel and a back surface of the plunger; and
   a first gasket around the plunger of the first spring-loaded contact such that the plunger extends from the top surface of the connector assembly housing and beyond the first gasket, wherein the first gasket comprises:
      an outer edge located on the top surface of the connector assembly housing;
      an inner edge around the plunger of a corresponding spring-loaded contact; and
      a recess between the outer edge and the inner edge.

15. The connector assembly of claim 14 wherein the connector assembly housing further comprises a second passage, and further comprising:
   a second spring-loaded contact in the second passage and comprising a plunger in a barrel.

16. The connector assembly of claim 14 wherein the recess comprises a bellows.

17. A connector assembly comprising:
a connector assembly housing having a first passage;
a first spring-loaded contact in the first passage, wherein the first spring-loaded contact comprises:
  a barrel having a bottom surface at a first end and a front opening at a second end;
  a plunger in the barrel and having a contacting portion extending from the front opening of the barrel and a top surface of the connector assembly housing; and
  a spring between the bottom surface of the barrel and a back surface of the plunger;
a first gasket around the plunger of the first spring-loaded contact, wherein the first gasket comprises:
  an outer edge located on the top surface of the connector assembly housing;
  an inner edge around the plunger of a corresponding spring-loaded contact; and
  a recess between the outer edge and the inner edge,
wherein the connector assembly housing further comprises a second passage, the connector assembly further comprising:
a second spring-loaded contact in the second passage and comprising a plunger in a barrel; and
a second gasket around the plunger of the second spring-loaded contact.

18. The connector assembly of claim 17 wherein the first gasket and the second gasket are formed of silicone, and wherein the plunger of the first spring-loaded contact extends from the top surface of the connector assembly housing and beyond the first gasket.

19. The connector assembly of claim 17 wherein each of the first spring-loaded contact and the second spring-loaded contact further comprises a barb around an outside surface of the barrel.

20. The connector assembly of claim 17 wherein the plunger for each of the first spring-loaded contact and the second spring-loaded contact comprises a circumferential groove to accept the inner edge of the corresponding gasket.

* * * * *